United States Patent
Anderson et al.

(10) Patent No.: US 8,445,965 B2
(45) Date of Patent: May 21, 2013

(54) STRAINED SEMICONDUCTOR DEVICES AND METHODS OF FABRICATING STRAINED SEMICONDUCTOR DEVICES

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 12/940,115

(22) Filed: Nov. 5, 2010

(65) Prior Publication Data

US 2012/0112284 A1    May 10, 2012

(51) Int. Cl.
 *H01L 27/12*    (2006.01)
(52) U.S. Cl.
 USPC ............ 257/351; 257/E27.112; 257/E21.704; 257/151; 257/153; 257/249; 257/314; 257/331; 257/366; 257/387
(58) Field of Classification Search
 USPC .................. 257/369, 274, 296, 288, E29.255, 257/E29.345, E27.062, E21.24, 351, 151, 257/E27.112, E21.704, 249; 438/761
 See application file for complete search history.

(56) References Cited

U.S. PATENT DOCUMENTS

| | | | |
|---|---|---|---|
| 7,531,401 B2 | 5/2009 | Baiocco et al. | |
| 7,569,892 B2 | 8/2009 | Zhu et al. | |
| 7,615,433 B2 | 11/2009 | Lim et al. | |
| 7,659,174 B2 | 2/2010 | Lee et al. | |
| 7,718,496 B2 | 5/2010 | Frank et al. | |
| 2003/0040158 A1 | 2/2003 | Saitoh | |
| 2007/0102768 A1* | 5/2007 | Shimizu et al. | 257/369 |
| 2007/0108525 A1* | 5/2007 | Yang et al. | 257/351 |
| 2007/0187727 A1* | 8/2007 | Ting et al. | 257/274 |
| 2008/0124855 A1 | 5/2008 | Widodo et al. | |
| 2009/0294986 A1 | 12/2009 | Yan et al. | |
| 2010/0133621 A1* | 6/2010 | Frohberg et al. | 257/368 |
| 2010/0164011 A1 | 7/2010 | Frank et al. | |
| 2011/0018044 A1* | 1/2011 | Lim et al. | 257/296 |

* cited by examiner

*Primary Examiner* — Marc Arman
(74) *Attorney, Agent, or Firm* — Schmeiser, Olsen & Watts;; Michael LeStrange

(57) ABSTRACT

A structure and method of fabricating the structure. The structure includes a first region of a semiconductor substrate separated from a second region of the semiconductor substrate by trench isolation formed in the substrate; a first stressed layer over the first region; a second stressed layer over second region; the first stressed layer and second stressed layer separated by a gap; and a passivation layer on the first and second stressed layers, the passivation layer extending over and sealing the gap.

24 Claims, 4 Drawing Sheets

STRAINED SEMICONDUCTOR DEVICES AND METHODS OF FABRICATING STRAINED SEMICONDUCTOR DEVICES

FIELD OF THE INVENTION

The present invention relates to the field of semiconductor devices; more specifically, it relates to strained semiconductor devices and the methods of fabricating strained semiconductor devices.

BACKGROUND

Strained devices utilize the principle that the mobility of carriers in semiconductor devices can be manipulated by stressing the semiconductor material. However, present techniques can result in non-uniform strain. Accordingly, there exists a need in the art to mitigate the deficiencies and limitations described hereinabove.

SUMMARY

A first aspect of the present invention is a structure, comprising: a first region of a semiconductor substrate separated from a second region of the semiconductor substrate by trench isolation formed in the substrate; a first stressed layer over the first region; a second stressed layer over second region; the first stressed layer and second stressed layer separated by a gap; and a passivation layer on the first and second stressed layers, the passivation layer extending over and sealing the gap.

A second aspect of the present invention is a method, comprising: forming a first region of a semiconductor substrate separated from a second region of the semiconductor substrate by trench isolation in the substrate; forming a first stressed layer over the first region; forming a second stressed layer over second region, the first and second stressed layers overlapping over the trench isolation; removing the overlapped first and second stressed layers to form a gap separating the first stressed layer from second stressed layer; and forming a passivation layer on the first and second stressed layers, the passivation layer extending over and sealing the gap.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

In n-channel field effect transistors (NFETs), the mobility of the majority carriers, electrons, is greater (hole mobility is less) when the channel is in tensile stress in the direction of current flow. In p-channel field effect transistors (PFETs) the mobility of the majority carriers, holes, is greater (electron mobility is less) when the channel region is in compressive stress in the direction of current flow. Increasing the mobility of majority carriers increases the performance of the device. Formation of an internally stressed layer over an FET induces the same type of stress as the overlying stressed layer into the channel of the FET. Such an FET is termed "a strained device" or "strained FET."

The embodiments presented herein describe a structure and a method whereby oppositely stressed layers are formed on different regions of a semiconductor substrate. The stressed layers induce strain into the underlying semiconductor substrate. In selected regions, the oppositely stressed layers are spaced apart and do not overlap and do not abut so in the selected regions there is no region where the stresses in the stressed layers are directly opposing each other. However, there may or may not be other regions of the semiconductor substrate where the stressed layers do overlap.

Figure 1:
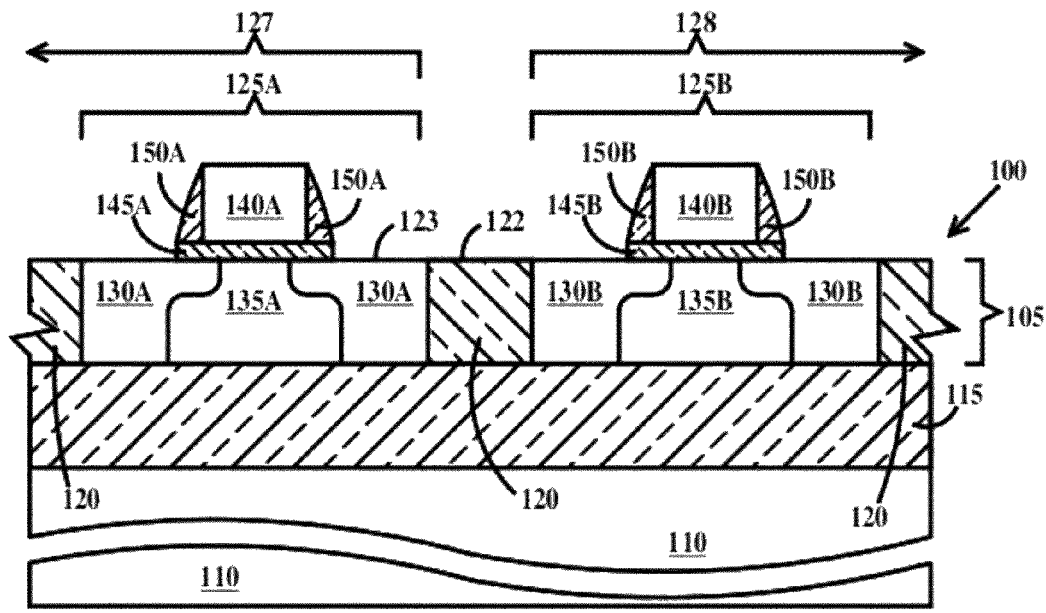
FIGS. 1 through 7 are cross-sectional views illustrating fabrication of strained semiconductor devices according to an embodiment of the present invention.

FIGS. 1 through 7 are cross-sectional views illustrating fabrication of strained semiconductor devices according to an embodiment of the present invention. In FIG. 1, a silicon-on-insulator (SOI) substrate 100 includes an upper semiconductor layer 105 separated from a lower supporting substrate 110 by a buried oxide layer 115. In one example, upper semiconductor layer 105 is single-crystal silicon. Formed in upper substrate 105 is trench isolation 120. A top surface 122 of trench isolation 120 is coplanar with a top surface 123 of semiconductor layer 105. Trench isolation 120 extends to abut buried oxide layer 115. In one example, trench isolation 120 is formed, by etching (e.g., by reactive ion etch (RIE)) a trench into semiconductor layer using a patterned photoresist layer as an etch mask, removing the photoresist, depositing an insulating layer to overfill the trench and then performing a chemical-mechanical-polish (CMP) to coplanarize the top surface 122 of the trench isolation 120 and the top surface 123 of semiconductor layer 105. In one example, trench isolation 120 comprises silicon oxide ($SiO_2$).

Next an n-channel field effect transistor (NFET) 125A is formed in a region 127 of substrate 100 and a p-channel field effect transistor (PFET) 125B is formed in a region 128 of substrate 100. Regions 127 and 128 are separated by a region trench isolation 120. NFET 125A includes N-type source/drains 130A separated by a P-type channel region 135A under a gate electrode 140A. Gate electrode 140A is electrically isolated from source/drains 130A and channel region 135A by a gate dielectric layer 145A. Insulating sidewall spacers 150A are formed opposite side walls of gate electrode 140A. PFET 125B includes P-type source/drains 130B separated by an N-type channel region 135B under a gate electrode 140B. Gate electrode 140B is electrically isolated from source/drains 130B and channel region 135B by a gate dielectric layer 145B. Insulating sidewall spacers 150B are formed opposite side walls of gate electrode 140B.

In one example, sidewall spacers 150A and 150B comprise silicon nitride ($Si_3N4$), $SiO_2$ or combinations of layers thereof. In one example, gate electrodes 140A and 140B comprise doped or undoped polysilicon.

Figure 2:
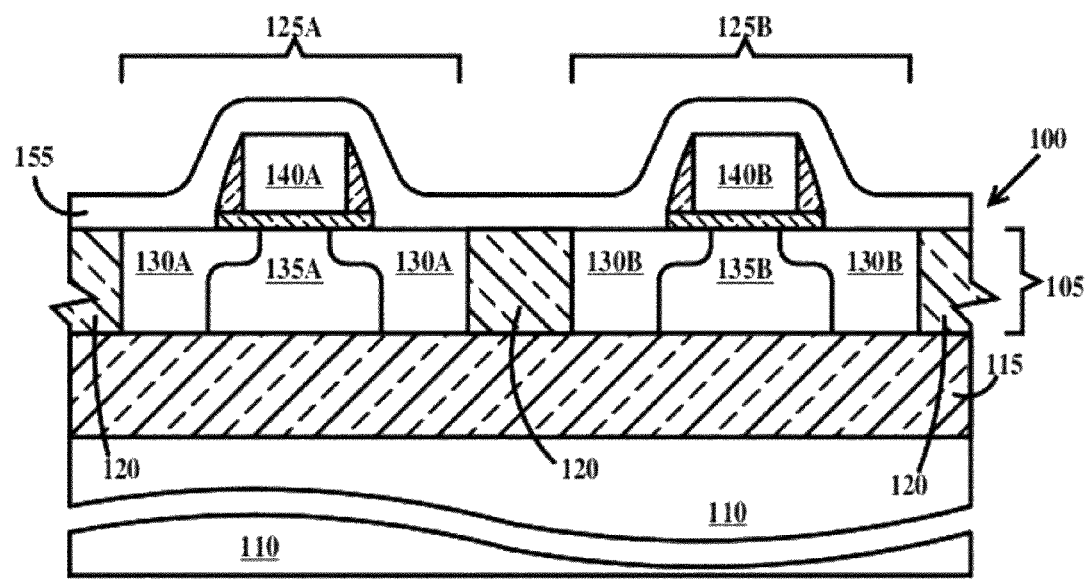

In FIG. 2, a dielectric tensile stressed layer 155 is formed over NFET 125A, PFET 125B and trench isolation 120. In one example, tensile stressed layer 155 is $Si_3N_4$. In one example, a tensile stressed $Si_3N_4$ layer is formed by low-pressure chemical vapor deposition (LPCVD) using silane ($SiH_4$) and ammonia ($NH_3$) precursor gases. In one example, a tensile stressed layer 155 is between about 50 nm and about 100 nm thick. In one example, the amount of tensile stress applied to NFET 125A by tensile stressed layer 155 is between about 0.5 GPa and about 4 GPa.

Figure 3:
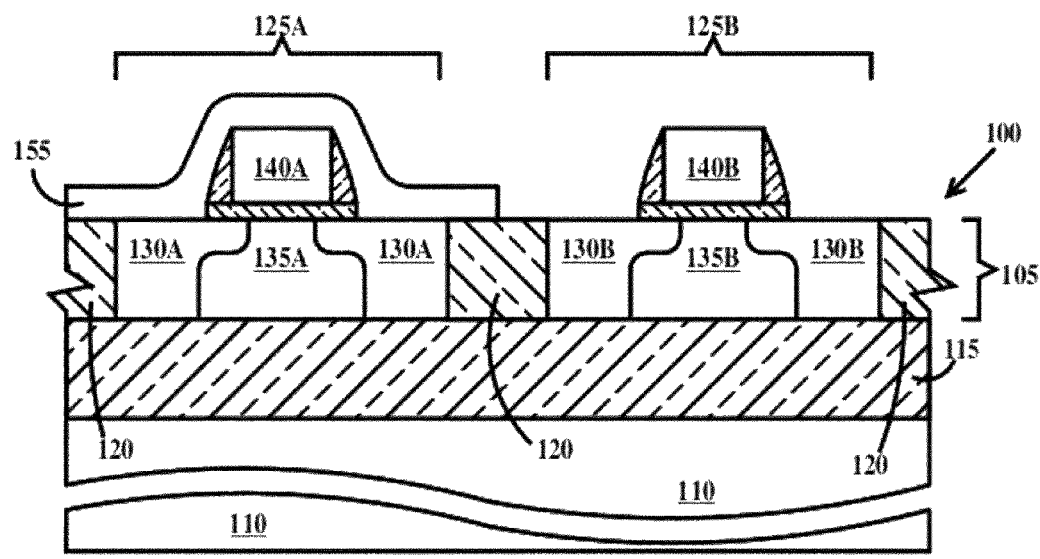

In FIG. 3, tensile stressed layer 155 is removed from over PFET 125B using a photolithographic/etch process. For example, a patterned photoresist layer is formed over tensile stressed layer 155 and the tensile stressed layer etched, for example, using RIE, where the tensile stressed layer is not covered by the patterned photoresist layer, followed by removal of the patterned photoresist layer. In FIG. 3, tensile stressed layer overlaps a region of trench isolation 120 between NFET 125A and PFET 125B. Tensile stressed layer 155 does not overlap any region of PFET 125B.

Figure 4:
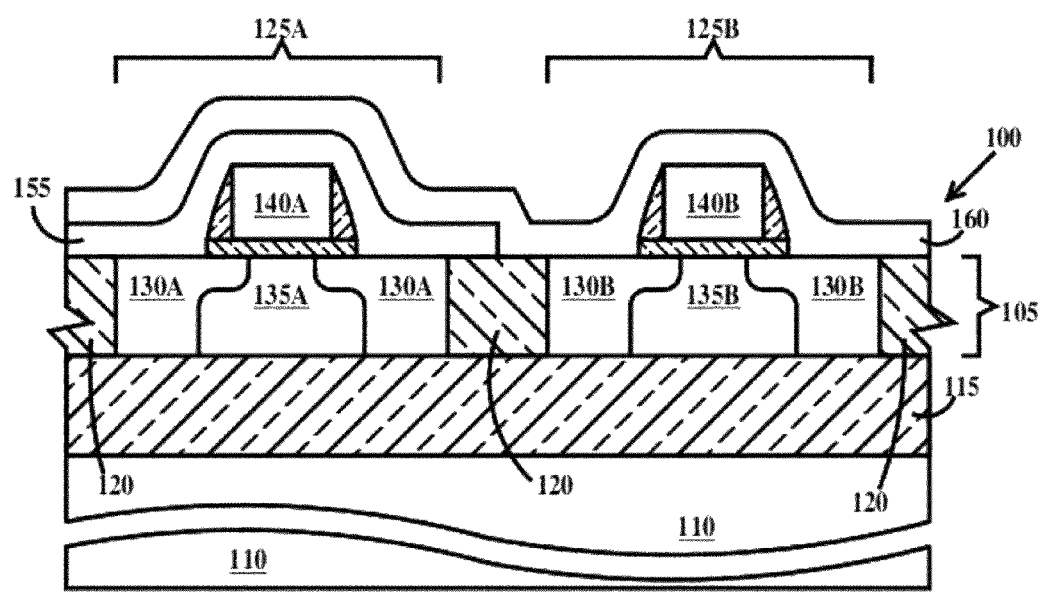

In FIG. 4, a dielectric compressive stressed layer 160 is formed over PFET 125B, trench isolation 120 and remaining portions of tensile stressed layer 155. In one example, compressive stressed layer 160 is $Si_3N_4$. In one example, a compressive stressed $Si_3N_4$ layer is formed by high density plasma (HDP) deposition or plasma enhanced chemical vapor deposition (PECVD) using $SiH_4$, $NH_3$ and nitrogen ($N_2$) precursor gases. In one example, a compressive stressed layer 160 is between about 60 nm and about 120 nm thick. In one example, the amount of compressive stressed applied to PFET 125B by compressive stressed layer 160 is between about 0.5 GPa and about 4 GPa.

Figure 5:
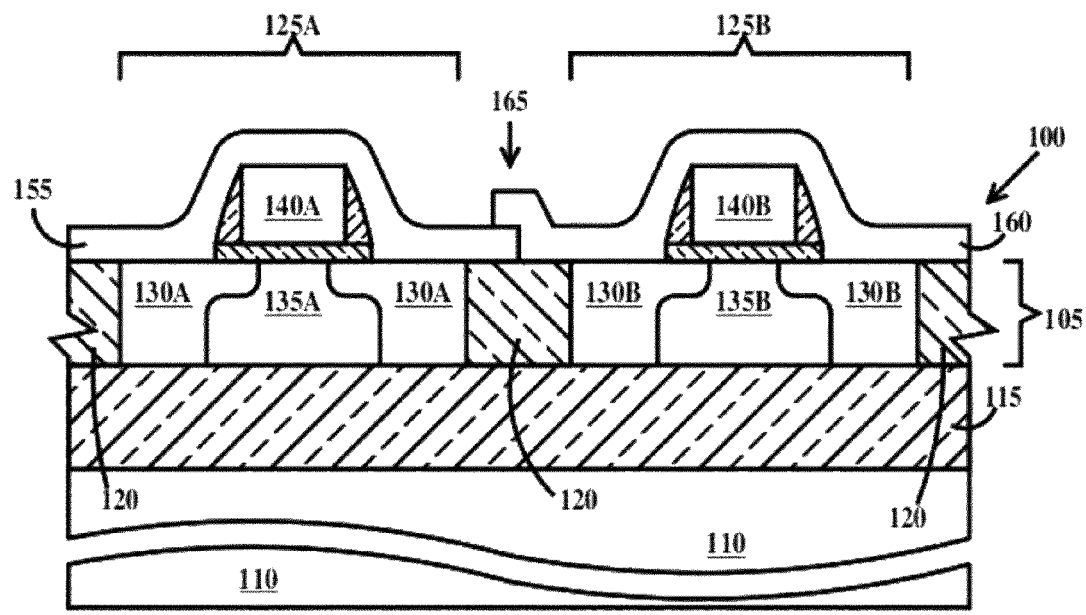

In FIG. 5, compressive stressed layer 160 is removed from over NFET 125A using a photolithographic/etch process. For example, a patterned photoresist layer is formed over compressive stressed layer 160 and the compressive stressed layer etched, for example, using RIE, where the compressive stressed layer is not covered by the patterned photoresist layer, followed by removal of the patterned photoresist layer. In FIG. 5, compressive stressed layer 160 overlaps a region of trench isolation 120 between NFET 125A and PFET 125B. Compressive stressed layer 160 overlaps tensile stressed layer 155 in an overlap region 165. Compressive stressed layer 160 does not overlap any region of NFET 125A. Overlap region 165 does not extend over NFET 125A or PFET 125B.

It should be understood though tensile stressed layer 155 has been illustrated as being formed and etched before forming compressed stressed layer 160, alternatively compressed stressed layer 160 be formed and etched before forming tensile stressed layer 155. This would result in tensile stressed layer 155 being on top of compressed stressed layer 160 in overlap region 165.

Figure 6:
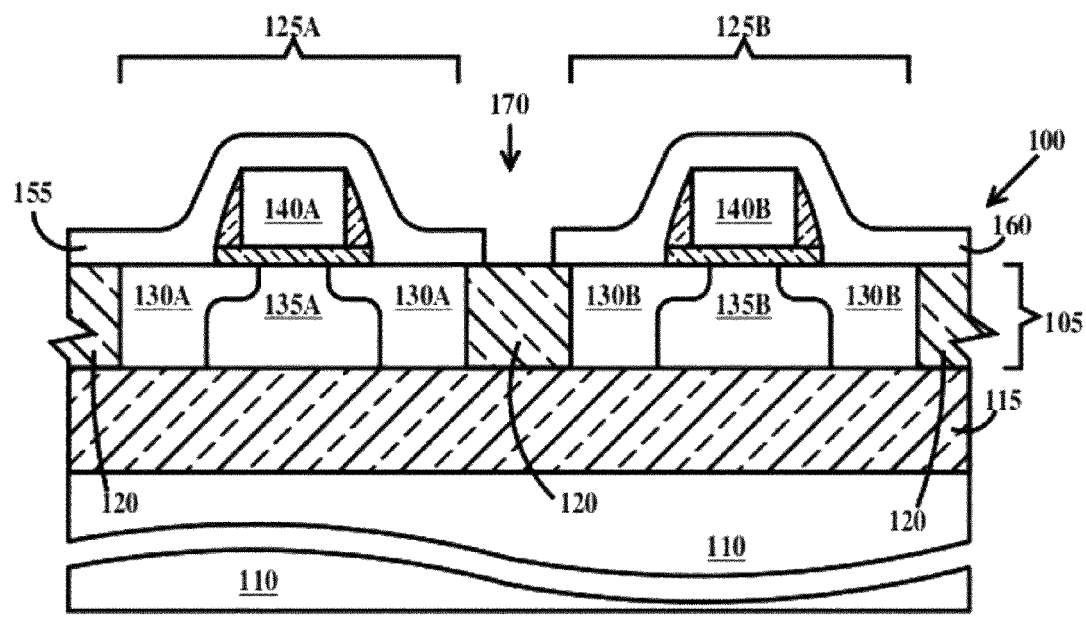

In FIG. 6, tensile stressed layer 155 and compressive stressed layer 160 have been removed in overlap region 165 (see FIG. 5) using a photolithographic/etch process to form a gap 170 between tensile stressed layer 125A and compressive stressed layer 160. For example, a patterned photoresist layer is formed over tensile stressed layer 155 and compressive stressed layer 160 and the tensile and compressive stressed layers etched, for example, using RIE, where the compressive stressed layer is not covered by the patterned photoresist layer (i.e., in overlap region 165 of FIG. 5), followed by removal of the patterned photoresist layer. Trench isolation 120 is exposed in gap 170 and gap 170 is fully landed (i.e., does not extend over any regions of silicon layer 105) on trench isolation 120.

Because tensile stressed layer 155 and compressive stressed layer 160 are not overlapped and because tensile stressed layer 155 does not abut compressive stressed layer 160 due to gap 170, the stressed induced into NFET 125A is only due to tensile stressed layer 155 and is not influenced by compressive stressed layer 160. Because tensile stressed layer 155 and compressive stressed layer 160 are not overlapped and because tensile stressed layer 155 does not abut compressive stressed layer 160 due to gap 170, the stressed induced into PFET 125B is only due to compressive stressed layer 160 and is not influenced by tensile stressed layer 155. Further the stress induced in the semiconductor regions of NFET 125A and PFET 125B is more uniform as the effect of overlapped stress layers on the underlying substrate is highest proximate to the overlapped region and diminishes with distance.

Figure 7:
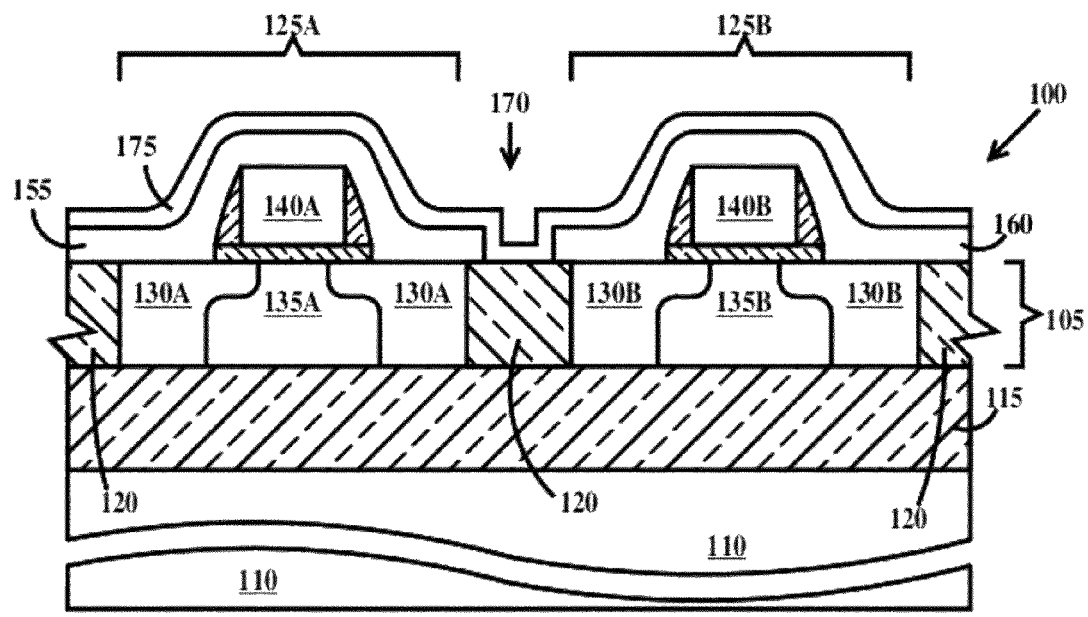

In FIG. 7, a passivation layer 170 is formed over tensile stressed layer 155, compressive stressed layer 160 and trench isolation 120 in gap 170. Passivation layer 175 seals the gap and prevents contaminants entering NFET 125A or PFET 125B by diffusion through trench isolation 120 into silicon layer 105. In one example, passivation layer 175 is unstressed. In one example, passivation layer 175 is in a compressive stress less than that of compressive stressed layer 160. In one example, passivation layer 175 is in a tensile stress less than that of tensile stressed layer 155. In one example, passivation layer 175 is unstressed $Si_3N_4$. In one example, passivation layer 175 is $Si_3N_4$ in a compressive stress less than that of compressive stressed layer 160. In one example, passivation layer 175 is $Si_3N_4$ in a tensile stress less than that of tensile stressed layer 155. It is preferred that the amount of stress in passivation layer 175 (whether compressive or tensile) be as low as possible. In one example, passivation layer 175 is a $Si_3N_4$ layer which is formed by high density plasma (HDP) deposition or plasma enhanced chemical vapor deposition (PECVD) using $SiH_4$, $NH_3$ and nitrogen ($N_2$) precursor gases. In one example, a passivation layer is between about 20 nm and about 40 nm thick.

Figure 8:
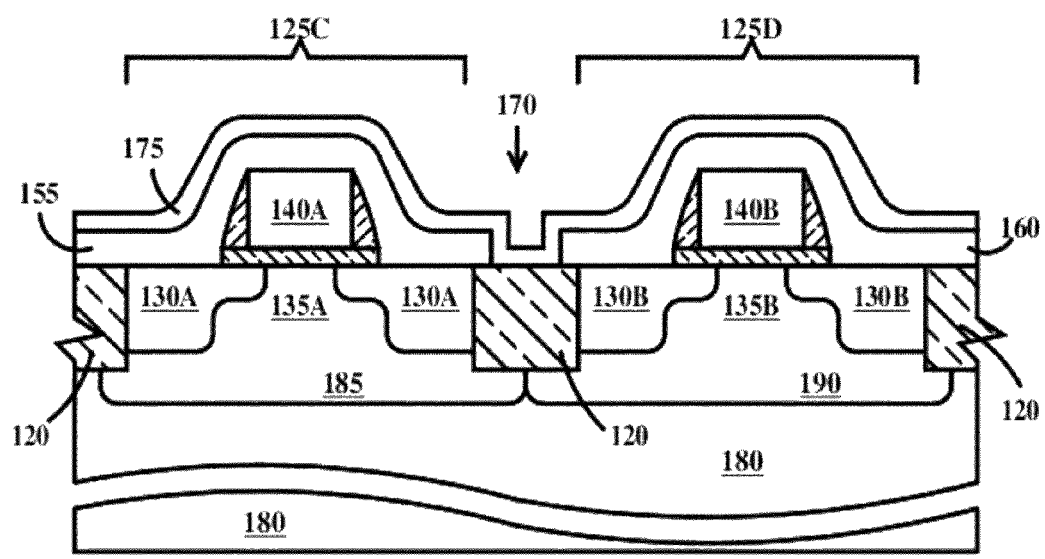
FIG. 8 is a cross-sectional view of strained devices similar to those illustrated in FIG. 7 fabricated in a bulk semiconductor substrate.

FIG. 8 is a cross-sectional view of strained devices similar to those illustrated in FIG. 7 fabricated in a bulk semiconductor substrate. In FIG. 8, an NFET 125C and a PFET 125D have been fabricated in a bulk semiconductor substrate 180. In one example, substrate 180 is single-crystal silicon. NFET 125C is similar to NFET 125A except source/drains 130A and channel region 135A are formed in a P-well 185. PFET 125D is similar to PFET 125B except source/drains 130B and channel region 135B are formed in an N-well 190.

Thus the embodiments of the present invention provide more uniformly strained semiconductor devices by eliminating the overlap of differently stressed films in selected regions of the integrated circuit chip.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   a first region of a semiconductor substrate separated from a second region of said semiconductor substrate by trench isolation formed in said substrate;
   a first field effect transistor comprising a first source/drains on opposite sides of a first channel region formed in said first region and a first gate electrode formed over said first channel region; and
   a second field effect transistor comprising second source/drains on opposite sides of a second channel region formed in said second region and a second gate electrode formed over said second channel region
   a first stressed layer having a first thickness over first gate electrode, said first stressed layer over said first region, said first stressed layer extending over all of said first gate electrode and extending over all of said first source/drains;

a second stressed layer having a second thickness over said second gate electrode, said second stressed layer over second region, said second stressed layer extending over all of said second gate electrode and extending over all of said second source/drains;

said first stressed layer and second stressed layer separated by a gap;

a conformal passivation layer having a third thickness measured over a top surface of said first gate electrode or measured over a top surface of said second gate electrode, said conformal passivation layer directly on top surfaces of said first and second stressed layers and regions of a top surface of said trench isolation in said gap, a top surface of said passivation layer following the contours of said top surfaces of said first and second stressed layers and extending over and sealing said gap, said conformal passivation layer extending over all of said first field effect transistor and all of said second field effect transistor; and wherein said third thickness is less than said first thickness and said third thickness is less than said second thickness.

2. The structure of claim 1, wherein said first stressed layer is in tensile stress and said second stressed layer is in compressive stress.

3. The structure of claim 1, wherein said first stressed layer is silicon nitride in tensile stress and said second stressed layer is silicon nitride in compressive stress.

4. The structure of claim 1, wherein said conformal passivation layer is silicon nitride.

5. The structure of claim 1, wherein said first field effect transistor is an NFET and said second second field effect transistor is a PFET; and wherein said first stressed layer is silicon nitride in tensile stress and said second stressed layer is silicon nitride in compressive stress.

6. The structure of claim 1, wherein said semiconductor substrate comprises a silicon layer separated from a silicon substrate by a buried oxide layer and said first source/drains, said first channel region, said second source/drains, said second channel region and said trench isolation are formed in said silicon layer.

7. The structure of claim 1, wherein a first distance between a top surface of said substrate and a top surface of said conformal passivation layer over said first and second stressed regions is greater than a second distance between said top surface of said substrate and said top surface of said conformal passivation layer over said gap.

8. The structure of claim 1, wherein a thickness of said conformal passivation layer over said gap is less than said first thickness of and less than said second thickness.

9. The structure of claim 1, wherein said conformal passivation layer is unstressed.

10. The structure of claim 1, wherein said conformal passivation layer is in a compressive stress less than that of said second stressed layer.

11. The structure of claim 1, wherein said conformal passivation layer is in a tensile stress less than that of said first stressed layer.

12. The structure of claim 1, wherein:

said first field effect transistor and second field effect transistors are separated by trench isolation formed in said semiconductor substrate under said gap; and said first stressed layer overlaps said trench isolation and said second stressed layer overlaps said trench isolation.

13. A method, comprising:

forming a first region of a semiconductor substrate separated from a second region of said semiconductor substrate by trench isolation in said substrate;

forming a first field effect transistor in said first region, said first field effect transistor comprising a first source/drains on opposite sides of a first channel region formed in said first region and a first gate electrode formed over said first channel region; and forming a second field effect transistor in said second region, said second field effect transistor comprising second source/drains on opposite sides of a second channel region formed in said second region and a second gate electrode formed over said second channel region;

forming a first stressed layer over said first region, said first stressed layer having a first thickness over said first gate electrode;

forming a second stressed layer over second region, said first stressed layer having a first thickness over said second gate electrode, said first and second stressed layers overlapping over said trench isolation, said second stressed layer extending over all of said second gate electrode and extending over all of said second source/drains;

removing said overlapped first and second stressed layers to form a gap separating said first stressed layer from second stressed layer, after said removing (i) said first stressed layer extending over all of said first gate electrode and extending over all of said first source/drains and (ii) said second stressed layer extending over all of said second gate electrode and extending over all of said second source/drains;

forming a conformal passivation layer having a third thickness measured over a top surface of said first gate electrode or measured over a top surface of said second gate electrode directly on top surfaces of said first and second stressed layers and regions of a top surface of said trench isolation in said gap, a top surface of said passivation layer following the contours of said top surfaces of said first and second stressed layers and extending over and sealing said gap, said conformal passivation layer extending over all of said first field effect transistor and all of said second field effect transistor; and wherein said third thickness is less than said first thickness and said third thickness is less than said second thickness.

14. The method of claim 13, wherein said first stressed layer is in tensile stress and said second stressed layer is in compressive stress.

15. The method of claim 13, wherein said first stressed layer is silicon nitride in tensile stress and said second stressed layer is silicon nitride in compressive stress.

16. The method of claim 13, wherein said conformal passivation layer is silicon nitride.

17. The method of claim 13, wherein said first source/drains, said first channel region and said first gate electrode comprise an NFET and said second source/drains, said second channel region and said second gate electrode comprise a PFET; and wherein said first stressed layer is silicon nitride in tensile stress and said second stressed layer is silicon nitride in compressive stress.

18. The method of claim 13, wherein said semiconductor substrate comprises a silicon layer separated from a silicon substrate by a buried oxide layer and said first source/drains, said first channel region, said second source/drains, said second channel region and said trench isolation are formed in said silicon layer.

19. The method of claim 13, wherein a first distance between a top surface of said substrate and a top surface of said conformal passivation layer over said first and second stressed regions is greater than a second distance between said top surface of said substrate and said top surface of said conformal passivation layer over said gap.

20. The method of claim 13, wherein a thickness of said conformal passivation layer over said gap is less than said first thickness of and less than said second thickness.

21. The method of claim 13, wherein said conformal passivation layer is unstressed.

22. The method of claim 13, wherein said conformal passivation layer is in a compressive stress less than that of said second stressed layer.

23. The method of claim 13, wherein said conformal passivation layer is in a tensile stress less than that of said first stressed layer.

24. The method of claim 13, wherein:
   said first field effect transistor and second field effect transistors are separated by trench isolation formed in said semiconductor substrate under said gap; and
   said first stressed layer overlaps said trench isolation and said second stressed layer overlaps said trench isolation.

* * * * *